(12) United States Patent
Naaman

(10) Patent No.: US 9,929,978 B2
(45) Date of Patent: Mar. 27, 2018

(54) SUPERCONDUCTING CROSS-BAR SWITCH SYSTEM

(71) Applicant: Ofer Naaman, Ellicott City, MD (US)

(72) Inventor: Ofer Naaman, Ellicott City, MD (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 250 days.

(21) Appl. No.: 14/877,515

(22) Filed: Oct. 7, 2015

(65) Prior Publication Data

US 2017/0104695 A1    Apr. 13, 2017

(51) Int. Cl.
| | |
|---|---|
| H03K 17/92 | (2006.01) |
| H04L 12/931 | (2013.01) |
| H04L 12/933 | (2013.01) |
| H01L 39/02 | (2006.01) |

(52) U.S. Cl.
CPC ............ *H04L 49/40* (2013.01); *H01L 39/025* (2013.01); *H04L 49/15* (2013.01)

(58) Field of Classification Search
CPC ....... B82Y 10/00; G06N 99/002; H03K 17/92
See application file for complete search history.

(56) References Cited

U.S. PATENT DOCUMENTS

| | | | |
|---|---|---|---|
| 5,982,219 A | 11/1999 | Kirichenko | |
| 7,310,459 B1 | 12/2007 | Rahman | |
| 2003/0054960 A1* | 3/2003 | Bedard | .................. H03K 17/92 505/100 |
| 2005/0058128 A1* | 3/2005 | Carson | ...................... G06T 7/20 370/388 |

FOREIGN PATENT DOCUMENTS

| | | |
|---|---|---|
| DE | 195 19 517 A1 | 12/1996 |
| WO | 2009/149086 A2 | 12/2009 |

OTHER PUBLICATIONS

Written Opinion & International Search Report for Application No. PCT/US2016/051751 dated Nov. 22, 2016.
(Continued)

*Primary Examiner* — Sibin Chen
(74) *Attorney, Agent, or Firm* — Tarolli, Sundheim, Covell & Tummino LLP

(57) ABSTRACT

A superconducting cross-bar switch system comprises a first input port coupled to a first output port through a first variable inductance coupling element, and a second output port through a third variable inductance coupling element, and a second input port coupled to the first output port through a second variable inductance coupling element, and the second output port through a fourth variable inductance coupling element. A switch controller controls the setting of the cross-bar switch between a Bar state and a Cross state by changing the variable inductance coupling elements between opposing inductance states. This allows for selective routing of signals between the first input port to the first output port and the second input port to the second output port in the Bar state, and the first input port to the second output port and the second input port to the first output port in the Cross state.

20 Claims, 4 Drawing Sheets

(56) References Cited

OTHER PUBLICATIONS

Worsham A H et al: "A Single Flux Quantum cross-bar switch and demultiplexer", IEEE Transactions on Applied Superconductivity, IEEE Service Center, Los Alamitos, CA, US, vol. 5, No. 2, Jun. 1, 1995, pp. 2996-2999.
Kaplunenko V et al: "Josephson junction arrays as a variable inductor in RF circuits and tunable filters; Josephson junction arrays as a variable inductor in RF circuits and tunable filters", Superconductor Scienve and Technology, IOP Publishing, Techno House, Bristol, GB, vol. 17, No. 5, May 1, 2004, pp. S145-S149.

\* cited by examiner

SUPERCONDUCTING CROSS-BAR SWITCH SYSTEM

This invention was made with Government support under Contract No. 30059298. The Government has certain rights in this invention.

TECHNICAL FIELD

The present invention relates generally to superconducting circuits, and more particularly to a superconducting cross-bar switch system.

BACKGROUND

Conventional microwave mechanical, electro-mechanical, and electronic switches may not compatible with on-chip integration with, and cryogenic operation of superconducting electronic circuits, because of incompatible fabrication processes and high power dissipation. Likewise, tunable filters that are commonly realized by use of either active components such as voltage-variable capacitors i.e. varactors, mechanical drivers, or ferroelectric and ferrite materials, are not easily controllable by signal levels that can be generated with single flux quantum (SFQ) technologies, and many are not operable at cryogenic temperatures. While superconducting microwave filters, both fixed and tunable, have been previously realized using both high temperature and low temperature superconductors, their use in switching applications suffered from high return loss, limited usable bandwidth, and poor out-of-band off-state isolation.

Semiconductor cross-bar switches, both for digital and microwave signals, are in wide use in reconfigurable signal routing applications such as switch matrices, transceivers, and test and communications systems. The cross-bar switch is a 4-port device, where in a first setting (referred to as 'Bar state') a first input port is connected to a first output port and a second input port is connected to a second output port, and in a second setting (referred to as 'Cross state') the first input port is connected to the second output port and the second input port is connected to the first output port. However, conventional cross-bar switches are generally not compatible with cryogenic ultra-low-power consumption applications and in general require voltage control signals of order of a few volts which are incompatible with SFQ control technologies.

SUMMARY

In one example, a superconducting cross-bar switch system is provided. The system comprises a first input port coupled to a first output port through a first variable inductance coupling element, and a second output port through a third variable inductance coupling element, and a second input port coupled to the first output port through a second variable inductance coupling element, and the second output port through a fourth variable inductance coupling element. The system further comprises a switch controller configured to control the setting of the cross-bar switch between a Bar state and a Cross state by changing the variable inductance coupling elements between opposing inductance states. This allows for selective routing of signals between the first input port to the first output port and the second input port to the second output port in the Bar state, and the first input port to the second output port and the second input port to the first output port in the Cross state.

In another example, a superconducting switch system is provided that comprises a first Superconducting Quantum Interference Device (SQUID) that couples a first input port to a first output port, a second SQUID that couples a second input port to the first output port, a third SQUID that couples the first input port to the second output port, and a fourth SQUID that couples the second input port to the first output port. The system further comprises a switch controller configured to control an amount of induced current through the first SQUID, the second SQUID, the third SQUID and the fourth SQUID to alternately switch between a Bar state and a Cross state. In the Bar state, a desired bandwidth portion of a first input signal provided at the first input port passes to the first output port and a desired bandwidth portion of a second input signal provided at the second input port is provided at the second output port. In the Cross state, a desired bandwidth portion of a first input signal provided at the first input port passes to the second output port and a desired bandwidth portion of the second input signal provided at the second input port is provided at the first output port.

In yet a further example, a superconducting cross-bar switch system is provided that comprises a filter network comprising a first SQUID that couples a first input port to a first output port, a second SQUID that couples a second output port to the first output port, a third SQUID that couples the first input port to the second output port, and a fourth SQUID that couples the second input port to the first output port. The first SQUID is formed of a first resonator, a first Josephson junction and a third resonator, and the second SQUID is formed of a second resonator, a second Josephson junction and a third resonator. A third SQUID is formed of the first resonator, a third Josephson junction and a fourth resonator, and a fourth SQUID is formed of the second resonator, a fourth Josephson junction and the fourth resonator. The first resonator is coupled between the first input port and the first and third Josephson junctions, and the second resonator is coupled between the second input port and the second and fourth Josephson junctions. The third resonator is coupled between the first output port and the first and second Josephson junctions, and the fourth resonator is coupled between the second output port and the third and fourth Josephson junctions. The system further comprises a switch controller configured to control an amount of induced current through the first SQUID, the second SQUID, the third SQUID and the fourth SQUID to alternately switch between a Bar state and a Cross state. In the Bar state, a desired bandwidth portion of a first input signal provided at the first input port passes to the first output port and a desired bandwidth portion of a second input signal provided at the second input port is provided at the second output port. In the Cross state, a desired bandwidth portion of a first input signal provided at the first input port passes to the second output port and a desired bandwidth portion of the second input signal provided at the second input port is provided at the first output port.

DETAILED DESCRIPTION

The present disclosure relates generally to superconducting circuits, and more particularly to a superconducting cross-bar switching system. The superconducting cross-bar switching system includes a superconducting cross-bar switch with a switch control system that includes a switch controller and bias elements. The superconducting cross-bar switch, also known as a cross-point or transfer switch, employs variable inductance coupling elements controlled by magnetic flux via the bias elements and the switch controller to couple and decouple different sections of the switch to and from one another to switch between a Bar state and a Cross state. The superconducting cross-bar switch operates at cryogenic temperatures, dissipates substantially no power, and can be controlled with single flux quantum (SFQ) compatible signals.

In one example, the variable inductance coupling elements can be Josephson junctions embedded in a microwave band-pass filter circuit that is implemented as a coupled-resonator filter topology in which the junctions function as variable coupling elements. The inductance of the Josephson junctions can be switched between a low inductance state for coupling different filter sections (e.g., resonators) to one another and to pass signals through these coupled sections, and a high inductance state to decouple different filter sections from one another to block signals from passing through the decoupled sections. The Josephson junctions can be arranged and controlled to switch the superconducting cross-bar switch between a Bar state and a Cross state to change the route of the signals passing through the cross-bar switch. A variable inductance coupling element can be arranged as a single Josephson junction or series array of N Josephson junctions, each having a critical current N times larger than the original Josephson junction.

Figure 1:
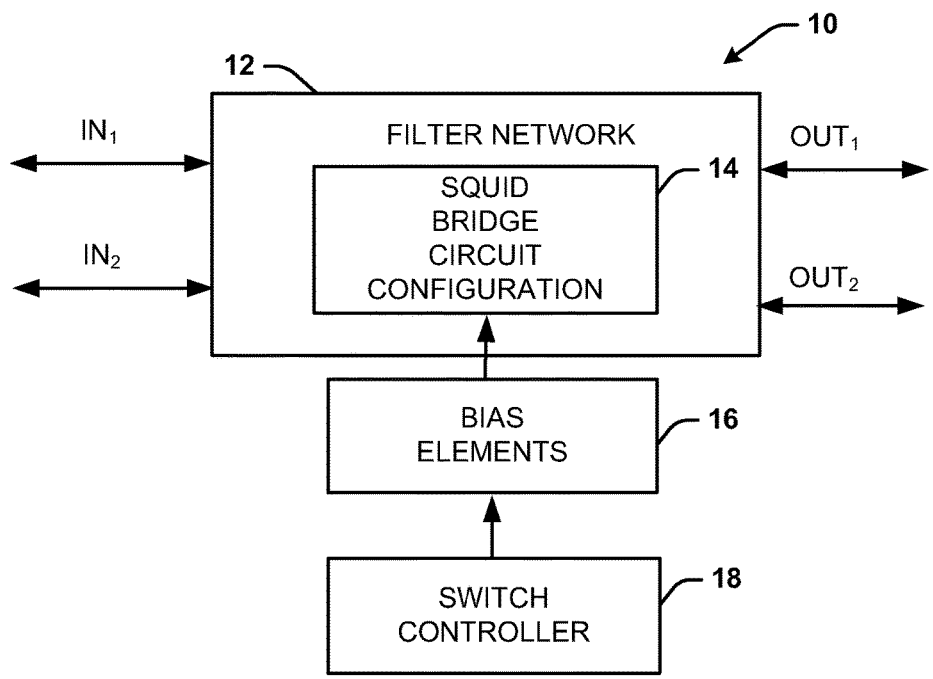
FIG. 1 illustrates an example of a superconducting cross-bar switch system.

FIG. 1 illustrates an example of a superconducting cross-bar switch system 10. The superconducting cross-bar switch system 10 routes a first signal from a first input port or terminal ($IN_1$) to a first output port or terminal ($OUT_1$) and a second signal from a second input port or terminal ($IN_2$) to a second output port or terminal ($OUT_2$) in a Bar mode, and routes the first signal from the first input port ($IN_1$) to the second output port ($OUT_2$) and the second signal from the second input port ($IN_2$) to the first output port in a Cross mode. The superconducting cross-bar switch system 10 can provide a band-pass filtered output signal that can corresponds to a desirable portion (e.g., particular frequency bandwidth) of a signal passing from each respective input port through the desired sections to a respective selected output port. Additionally, the undesired portion of the signals can be blocked, such that none of the undesired portion of the signals pass through the filter network to any of the output ports.

The superconducting cross-bar switch system 10 can be implemented in any of a variety of superconducting circuit systems to provide switch control of signals between two input ports and two output ports between two alternate paths. As an example, the signals can be microwave signals that are implemented in a control scheme for a quantum circuit, such as performing a gate or a readout operation on a qubit. As another example, the signals can be a signal pulse, a communication signal, or a control command signal. The superconducting cross-bar switch operates at cryogenic temperatures, dissipates substantially no power, and can be controlled with single flux quantum (SFQ) compatible signals.

As one example, the superconducting switch system 10 can include a superconducting cross-bar switch 12 formed from a microwave band-pass filter network that can include one or more impedance components (i.e., capacitors, inductors) for configuring a first input portion of the filter network 12 as one or more first input resonators or poles, a second input portion of the filter network 12 as one or more second input resonators or poles, a first output portion of the filter network as one or more first output resonators or poles, and a second output portion of the filter network as one or more second output resonators or poles. The superconducting cross-bar switching system 10 includes a switch controller 18 and bias elements 16. The superconducting cross-bar switch 12 employs variable inductance coupling elements controlled by magnetic flux via the bias elements 16 and the switch controller 18 to couple and decouple each input first and second input resonator to a respective one of each first and second output resonator based on a selected mode of either the Bar state or Cross state.

The variable inductance coupling elements can be Josephson junctions. The inductance of the Josephson junctions can be switched between a low inductance state for coupling different filter sections (e.g., resonators or poles) to one another and to pass signals through these coupled sections, and a high inductance state to decouple different filter sections from one another to block signals from passing through the decoupled sections. The Josephson junctions can be arranged and controlled between low and high inductance states to switch the superconducting cross-bar switch between a Bar state and a Cross state to control the route of the signals passing through the cross-bar switch. The Josephson junctions can be arranged as elements of RF SQUIDs or SQUIDs in a SQUID bridge circuit configuration 14.

Figure 2:
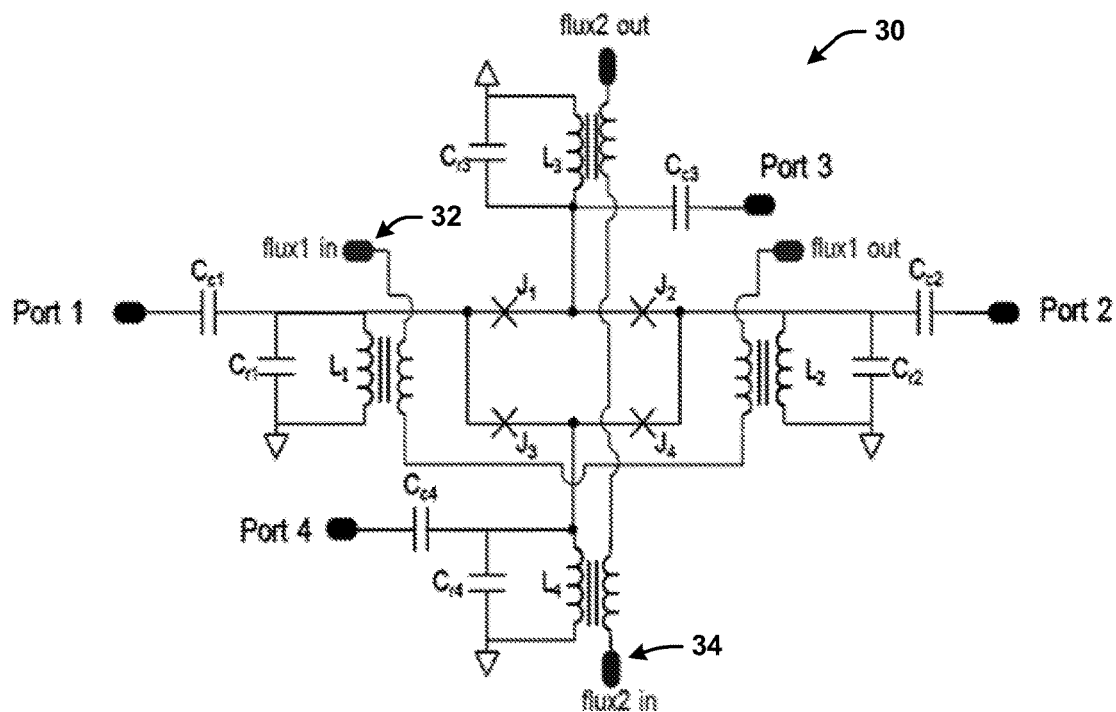
FIG. 2 illustrates a schematic diagram of a cross-bar switch circuit and associated bias elements.

The SQUID bridge circuit configuration 14 (as illustrated in FIG. 2) can includes a first SQUID that can include a first inductor and a third inductor coupled to opposite sides of a first Josephson junction, where the first inductor forms at least a portion of a first pole or resonator of the filter circuit, and the third inductor forms at least a portion of a third pole or resonator of the filter circuit. A second SQUID can be formed by a second inductor and the third inductor coupled to opposite sides of a second Josephson junction, a third SQUID can be formed by the first inductor and a fourth inductor coupled to opposite sides of a third Josephson junction, and a fourth SQUID can be formed by the second inductor and the fourth inductor coupled to opposite sides of a fourth Josephson junction. The second inductor forms at least a portion of a second pole or resonator of the filter circuit, and the fourth inductor forms at least a portion of a fourth pole or resonator of the filter circuit.

The Josephson junctions can have a first inductance when no current or a low current is induced in its respective SQUID, and a second inductance when a current or a higher current is induced in its respective SQUID that is at a predetermined threshold that generates or induces a flux, for example, greater than about 0.1 $\Phi_0$ and less than about 0.45 $\Phi_0$, where $\Phi_0$ is equal to a flux quantum. The first inductance (e.g., $\hbar/2e * 1/I_C$, where h is Planck's constant divided by $2\pi$, e is electron charge and $I_C$ is the critical current of the Josephson junction) can provide coupling between desired sections of a filter network, such to allow passing of a desired bandwidth portion of an input signal between opposing ends of the the desired sections. The second inductance (e.g., large inductance value) can provide decoupling between the sections of the filter network, such that the passing of the desired bandwidth portion of the input signal is blocked between opposing ends of the undesired sections.

In one example, the first pole of the filter network is coupled to a first input port, and the second pole of the filter network is coupled to a second input port. Furthermore, the third pole of the filter network is coupled to a first output port and the fourth pole of the filter network is coupled to a second output port. In a Bar state, flux can be induced in the second SQUID and the fourth SQUID causing the second and fourth Josephson junctions to have a high inductance, while flux is not induced in the first SQUID and the third SQUID causing the first and third Josephson junctions to have a low inductance. This allows for a first signal to pass from the first input port through the first pole and third pole to the first output port and blocking the first signal from passing to the second output port through the fourth pole. Additionally, a second signal can pass from the the second input port through the second pole and fourth pole to the second output port and blocking the second signal from passing to the first output port through the third pole.

In a Cross state, flux can be induced in the first SQUID and the third SQUID causing the first and third Josephson junctions to have a high inductance, while flux is not induced in the second SQUID and the fourth SQUID causing the second and fourth Josephson junctions to have a low inductance. This allows for a first signal to pass from the first input port through the first pole and fourth pole to the second output port and blocking the first signal from passing to the first output port through the third pole. Additionally, a second signal can pass from the the second input port through the second pole and third pole to the first output port and blocking the second signal from passing to the second output port through the fourth pole.

FIG. 2 illustrates a schematic diagram of a cross-bar switch circuit 30 and associated bias elements. The cross-bar switch circuit is formed of a band-pass filter having a first input port, labeled Port 1, a second input port, labeled Port 2, a first output port, labeled Port 3, and a second output port, labeled Port 4. Current is provided through a first control line 32 that is inductively coupled to a pole or resonator associated with the first input port Port 1 and that is inductively coupled to a pole or resonator associated with the second input port Port 2. Current is also provided through a second control line 34 that is coupled to a pole or resonator associated with the first output port Port 3 and that is inductively coupled to a pole or resonator associated with the second output port Port 4. In both a first configuration (e.g., Bar state) and a second configuration (e.g., Cross state), current flows through the first control line 32 in the direction from the flux1 in to flux1 out. In the first configuration, current flows through the second control line 34 in the direction of flux2 in to flux2 out, which results in a first signal at Port 1 to be routed to Port 3, and a second signal at Port 2 to be routed to Port 4, whereas all other pair-wise combinations of ports are mutually isolated. In the second configuration, current flows through the second control line 34 in the direction of flux2 out to flux2 in, which results in a first signal at Port 1 to be routed to Port 4, and a second signal at Port 2 to be routed to Port 3 whereas all other pair-wise combinations of ports are mutually isolated.

Referring to FIG. 2, consider signal propagation from Port 1 to Port 4 for the second configuration. The signal from Port 1 enters the circuit via series coupling capacitor $C_{c1}$ which provides an input coupling capacitance to a band-pass filter. The signal then passes through shunt resonator comprised of a parallel combination of $C_{r1}$ and $L_1$, forming the filter's first pole. Next the signal is coupled via junction $J_3$ to the filter's fourth pole, formed by the parallel combination of $C_{r4}$ and $L_4$, and finally exits the filter through the output coupling capacitor $C_{c4}$ into Port 4. Signal entering from Port 2 are similarly directed to Port 3 by traversing the band-pass filter formed by poles $C_{r2} \| L_2$ and $C_{r3} \| L_3$ and coupling elements $C_{c2}$, $J_2$, and $C_{c3}$. The control fluxes are arranged such that in this setting no signal can propagate through junctions $J_1$ and $J_4$ due to the high inductance state of these junctions as determined by the control fluxes.

In the first configuration of the control fluxes $J_2$ and $J_3$ are in a high inductance state, while $J_1$ and $J_4$ are in a low inductance state. In this first configuration a signal from Port 1 will be routed to Port 3 via the band-pass filter formed by poles $C_{r1} \| L_1$ and $C_{r3} \| L_3$ and coupling elements $C_{c1}$, $J_1$, and $C_{c3}$, while signals from Port 2 are routed to Port 4 via the band-pass filter formed by poles $C_{r2} \| L_2$ and $C_{r4} \| L4$ and coupling elements $C_{c2}$, $J_4$, and $C_{c4}$.

Each of the junctions $J_1$-$J_4$ is connected between two nodes of the circuit which are also connected to grounded inductors. For example, $J_1$ is connected to grounded inductors $L_1$ and $L_3$. Thus each of the junctions is embedded in a superconducting inductive loop forming an RF SQUID. When the RF SQUID loop encloses zero applied magnetic flux, the associated junction is in a low inductance state and allows transmission of microwave signals. When the RF SQUID loop encloses an externally applied flux that is a substantial fraction of $\Phi_0/2$, the associated junction is in a high inductance state and does not allow transmission of microwave signals. Therefore, the path that is traversed by microwave signal through the circuit is controlled by the fluxes applied to each of the RF SQUID loops.

For example, a flux $\Phi_{ON}$ which is substantially zero, corresponds to a low inductance state of the junction and a flux $\pm\Phi_{OFF}$ which is a significant fraction of $\pm\Phi_0/2$, corresponds to a high inductance state of the junction. For example, a current can be supplied from control line 32 port "flux 1 in" to port "flux 1 out", such that the flux coupled to inductor $L_1$ via the transformer in FIG. 2 is $(\Phi_{OFF}+\Phi_{ON})/2$ and the flux coupled to inductor $L_2$ via its transformer is $-(\Phi_{OFF}+\Phi_{ON})/2$ (negative sign due to the transformer's opposite winding). Furthermore, a current can be supplied from control line 34 port "flux 2 in" to "flux 2 out", such that the flux coupled $-(\Phi_{OFF}-\Phi_{ON})/2$ (negative sign due to the transformer's opposite winding).

In this situation, the flux enclosed by the $L_1$-$J_3$-$L_4$ RF SQUID is $(\Phi_{OFF}+\Phi_{ON})/2+(\Phi_{OFF}-\Phi_{ON})/2=\Phi_{OFF}$ and $J_3$ is in a high inductance state. Similarly the flux enclosed by the $L_2$-$J_2$-$L_3$ RF SQUID is $-(\Phi_{OFF}+\Phi_{ON})/2-(\Phi_{OFF}-\Phi_{ON})/2=-\Phi_{OFF}$ and junction $J_2$ is also in a high inductance state. The same configuration gives $\pm\Phi_{ON}$ in the $L_1$-$J_1$-$L_3$ and $L_4$-$J_4$-$L_2$ loops so that $J_1$ and $J_4$ are in the low inductance state. For this configuration of control currents, port 1 is connected to port 3, and port 2 is connected to port 4. If the sign of the current supplied on the "flux 2" line is reversed, so that now current flows from "flux 2 out" to "flux 2 in" then junctions $J_1$ and $J_4$ are in a high inductance state while junctions $J_2$ and $J_3$ are in a low inductance state, so that port 1 is now connected to port 4, and port 2 is now connected to port 3.

Figure 3:
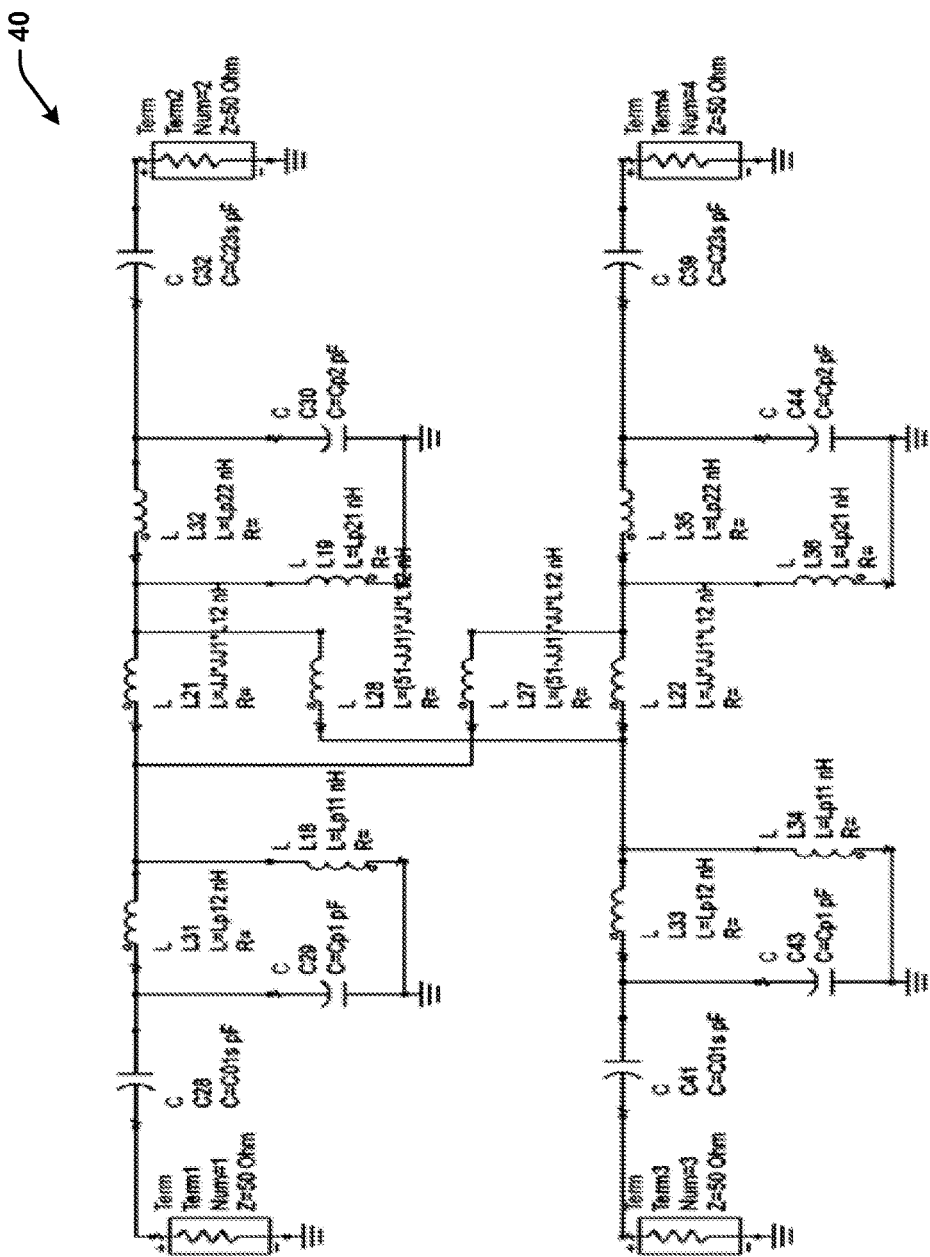
FIG. 3 illustrates a schematic circuit diagram of a cross-bar switch circuit utilized in a simulation employing Agilent's Advanced Design Simulation (ADS) tool.

FIG. 3 illustrates a schematic circuit diagram of a cross-bar switch circuit 40 utilized in a simulation employing Agilent's Advanced Design Simulation (ADS) tool. Inductors L21, L28, L27, and L22 represent the Josephson junctions. The component values are such that the input and output capacitors (C28, C32, C41, C39) are all 0.48 pF, the shunt capacitors (C29, C30, C43, C44) are all 0.625 pF, the shunt inductors (L31+L18, L32+L19, L34+L33, L36+L35) are all 429 pH and are tapped so that, for example, L34/(L34+L33)=0.95. The junction nominal inductances in their low inductance state are all 882 pH, and the high inductance state has 50 times greater inductance than the nominal value. Component values were selected such that the signal path approximates a $2^{nd}$-order Butterworth band pass filter response. Term1 and Term3 represent first and second input ports, while Term2 and Term4 represent first and second output ports.

Figure 4:
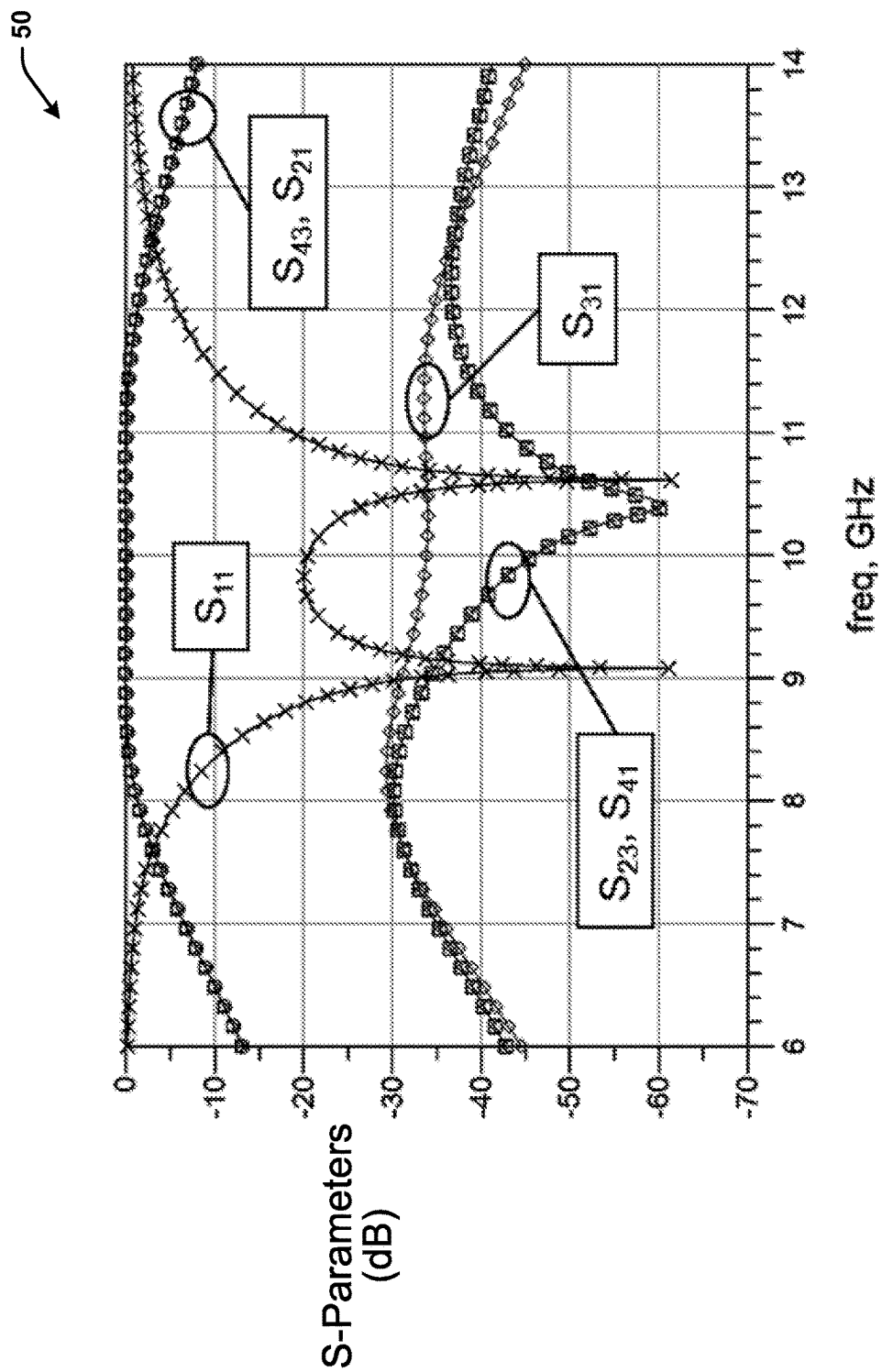
FIG. 4 illustrates a graph of an S-parameter simulation of the circuit of FIG. 3.
Figure 5:
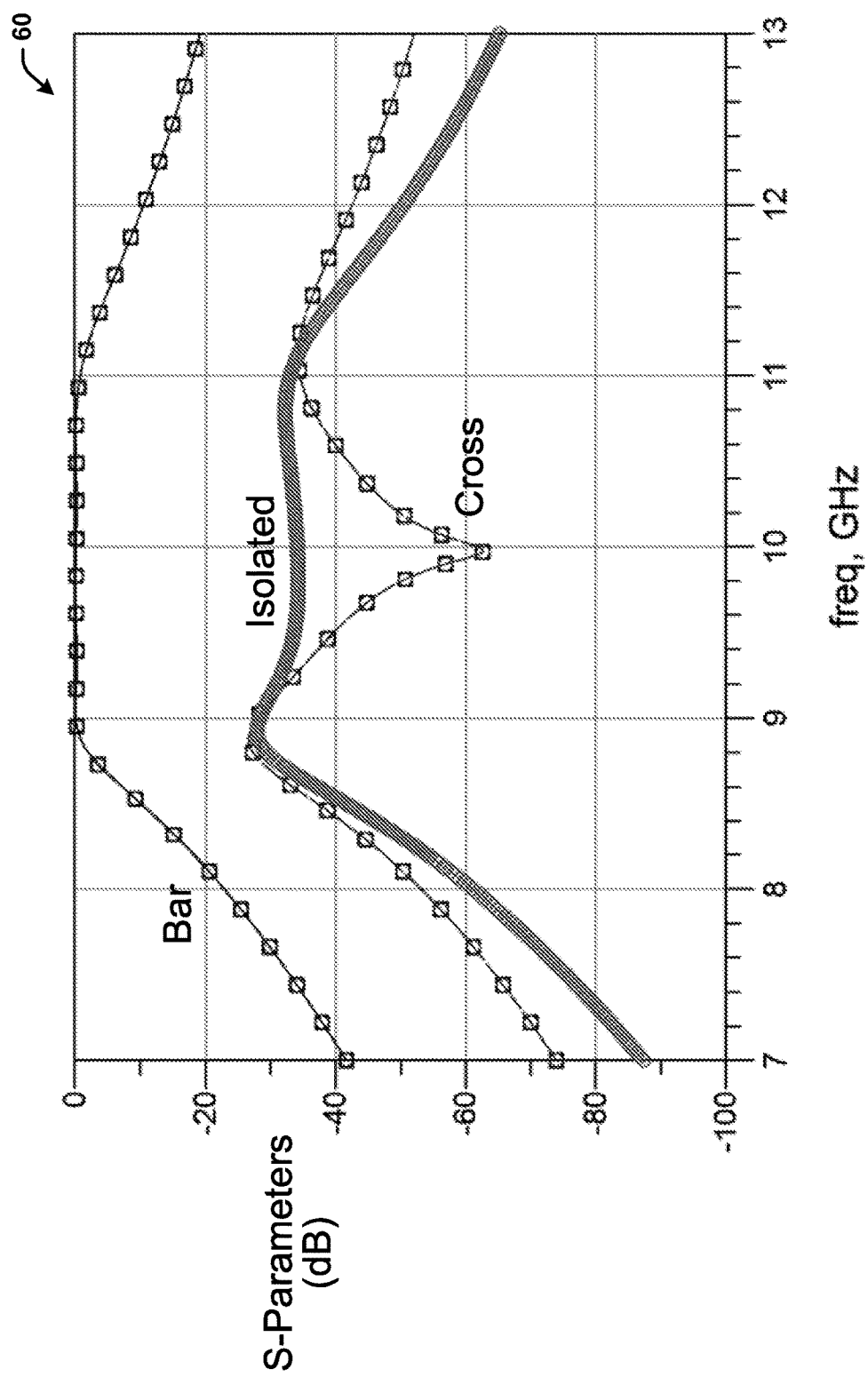
FIG. 5 illustrates a graph of an S-parameter simulation of a $4^{th}$ order Chebychev filter design.

FIG. 4 illustrates a graph 40 of an S-parameter simulation of the circuit of FIG. 3. In the graph 50, the switch is in the "Bar" position, connecting Term1 to Term2, and Term3 to Term4. As illustrated, the transmission between the connected ports follows the designed Butterworth filter response, with very low insertion loss and nearly 4 GHz of bandwidth. At the same time ports that are not connected to each other ($S_{23}$, $S_{41}$, and $S_{31}$ in the figure) show isolation of better than 30 dB. It is to be appreciated that several versions of the cross-bar switch circuit can be designed, each having different transfer characteristics. For example, a switch built with a $4^{th}$ order Chebychev filter design would provide S-parameter characteristics as illustrated in a graph 60 of an S-parameter simulation of a $4^{th}$ order Chebychev utilizing an ADS tool, as illustrated in FIG. 5. Therefore, the cross-bar switch described herein can be implemented in a variety of different filter configuration to fit requirements on, for example, bandwidth, ripple, number or sections, return loss, etc.

It is to be appreciated that control signals can be much more intense than the RF signals, and leakage of current from the control signal band into the RF signal band could be a concern. Control signals can be constrained to the stop-band of the filter in order to minimize this leakage. Leakage can be further reduced by applying the control signals through low-pass filters whose band does not overlap that of the RF passband. In the examples given above, switching rates of up to 2 GHz should be realizeable.

The intensity of the RF signals that can be routed through the switch is limited fundamentally by the junction critical current. In the examples given above, the maximum RF power that can be passed through the switch is around −90 dBm. It is to be appreciated that the cross-bar switch circuit can be designed to increase the maximum power by replacing each of the junctions $J_1$-$J_4$ with a series array of N junctions, each having a critical current N times larger than the original junction. For example, N=10 (10 junctions, each having ×10 higher critical current) will increase the maximum power by 20 dB.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. A superconducting cross-bar switch system comprising:
a first input port coupled to a first output port through a first variable inductance coupling element, and a second output port through a third variable inductance coupling element;
a second input port coupled to the first output port through a second variable inductance coupling element, and the second output port through a fourth variable inductance coupling element; and
a switch controller configured to control the setting of the cross-bar switch between a Bar state and a Cross state by changing the variable inductance coupling elements between opposing inductance states to allow selective routing of signals between the first input port to the first output port and the second input port to the second output port in the Bar state, and the first input port to the second output port and the second input port to the first output port in the Cross state.

2. The system of claim 1, wherein the first, second, third and fourth variable inductance coupling elements are each a series array of N Josephson junctions, each having a critical current N times larger than a single Josephson junction.

3. The system of claim 1, wherein the first variable inductance element is a first Josephson junction, the second variable inductance element is a second Josephson junction, the third variable inductance element is a third Josephson junction and the fourth variable inductance coupling element is a fourth Josephson junction.

4. The system of claim 3, further comprising a first resonator coupled between the first input port and the first and third Josephson junctions, a second resonator coupled between the second input port and the second and fourth Josephson junctions, a third resonator coupled between the first output port and the first and second Josephson junctions, and a fourth resonator coupled between the second output port and the third and fourth Josephson junctions.

5. The system of claim 4, wherein the first, second, third and fourth resonators each form at least a portion of a pole of a bandpass filter.

6. The system of claim 4, further comprising a first coupling capacitor coupled between the first input port and the first resonator, a second coupling capacitor coupled between the second input port and the second resonator, a third coupling capacitor coupled between the first output port and the third resonator, and a fourth coupling capacitor coupled between the second output port and the fourth resonator.

7. The system of claim 4, wherein the switch controller controls an amount of current through a first flux bias control line inductively coupled to the first resonator and the second resonator and an amount of current through a second flux bias control line coupled to the third resonator and the fourth resonator, and the polarity of current through one of the first flux bias control line and the second flux bias control line to alternate the system between a Bar state and a Cross state.

8. The system of claim 4, wherein the first resonator, the first Josephson junction and the third resonator form a first Superconducting Quantum Interference Device (SQUID), the second resonator, the second Josephson junction and the third resonator form a second SQUID, the first resonator, the third Josephson junction and the fourth resonator form a third SQUID, and the second resonator, the second Josephson junction and the fourth resonator form a fourth SQUID.

9. The system of claim 8, wherein the switch controller provides currents and polarity of current that results in the first SQUID and fourth SQUID having a net flux of approximately zero and the second SQUID and third SQUID having a net flux of about 0.1 $\Phi_0$ to about 0.45 $\Phi_0$, where $\Phi_0$ is equal to a flux quantum in a Bar state, and the second SQUID and third SQUID having a net flux of approximately zero and the first SQUID and fourth SQUID having a net flux of about 0.1 $\Phi_0$ to about 0.45 $\Phi_0$, where $\Phi_0$ is equal to a flux quantum in a Cross state.

10. The system of claim 1, wherein the switch controller sets the first and fourth variable inductance coupling elements to a low inductance, and the second and third variable inductance coupling elements to a high inductance in a Bar state, and sets the first and fourth variable inductance coupling elements to a high inductance, and the second and third variable inductance coupling elements to a low inductance in a Cross state.

11. A superconducting switch system comprising:
a first Superconducting Quantum Interference Device (SQUID) that couples a first input port to a first output port;
a second SQUID that couples a second input port to the first output port;
a third SQUID that couples the first input port to the second output port;
a fourth SQUID that couples the second input port to the first output port; and
a switch controller configured to control an amount of induced current through the first SQUID, the second SQUID, the third SQUID and the fourth SQUID to alternately switch between a Bar state in which a desired bandwidth portion of a first input signal provided at the first input port passes to the first output port and a desired bandwidth portion of a second input signal provided at the second input port is provided at the second output port, and a Cross state in which a desired bandwidth portion of a first input signal provided at the first input port passes to the second output port and a desired bandwidth portion of the second input signal provided at the second input port is provided at the first output port.

12. The system of claim 11, wherein the first SQUID is formed of a first resonator, a first Josephson junction and a third resonator, the second SQUID is formed of a second resonator, a second Josephson junction and a third resonator, a third SQUID is formed of the first resonator, a third Josephson junction and a fourth resonator, and a fourth SQUID is formed of the second resonator, a fourth Josephson junction and the fourth resonator.

13. The system of claim 12, wherein the first resonator is coupled between the first input port and the first and third Josephson junctions, the second resonator is coupled between the second input port and the second and fourth Josephson junctions, the third resonator is coupled between the first output port and the first and second Josephson junctions, and the fourth resonator is coupled between the second output port and the third and fourth Josephson junctions.

14. The system of claim 12, wherein the switch controller controls an amount of current through a first flux bias control line inductively coupled to the first resonator and the second resonator and an amount of current through a second flux bias control line coupled to the third resonator and the fourth resonator, and the polarity of current through one of the first flux bias control line and the second flux bias control line to alternate the system between a Bar state and a Cross state.

15. The system of claim 12, further comprising a first coupling capacitor coupled between the first input port and the first resonator, a second coupling capacitor coupled between the second input port and the second resonator, a third coupling capacitor coupled to the first output port and the third resonator, and a fourth coupling capacitor coupled between the second output port and the fourth resonator.

16. The system of claim 12, wherein the first, second, third and fourth resonators each form at least a portion of a pole of a bandpass filter.

17. The system of claim 11, wherein the switch controller provides currents and polarity of current to the when selecting between the Bar state and the Cross state that results in the first SQUID and fourth SQUID having a net flux of approximately zero and the second SQUID and third SQUID having a net flux of about $0.1\,\Phi_0$ to about $0.45\,\Phi_0$, where $\Phi_0$ is equal to a flux quantum in a Bar state, and the second SQUID and third SQUID having a net flux of approximately zero and the first SQUID and fourth SQUID having a net flux of about $0.1\,\Phi_0$ to about $0.45\,\Phi_0$, where $\Phi_0$ is equal to a flux quantum in a Cross state.

18. A superconducting cross-bar switch system comprising:
a filter network comprising a first Superconducting Quantum Interference Device (SQUID) that couples a first input port to a first output port, a second SQUID that couples a second output port to the first output port, a third SQUID that couples the first input port to the second output port, and a fourth SQUID that couples the second input port to the first output port, wherein the first SQUID is formed of a first resonator, a first Josephson junction and a third resonator, the second SQUID is formed of a second resonator, a second Josephson junction and a third resonator, a third SQUID is formed of the first resonator, a third Josephson junction and a fourth resonator, and a fourth SQUID is formed of the second resonator, a fourth Josephson junction and the fourth resonator, such that the first resonator is coupled between the first input port and the first and third Josephson junctions, the second resonator is coupled between the second input port and the second and fourth Josephson junctions, the third resonator is coupled between the first output port and the first and second Josephson junctions, and the fourth resonator is coupled between the second output port and the third and fourth Josephson junctions; and
a switch controller configured to control an amount of induced current through the first SQUID, the second SQUID, the third SQUID and the fourth SQUID to alternately switch between a Bar state in which a desired bandwidth portion of a first input signal provided at the first input port passes to the first output port and a desired bandwidth portion of a second input signal provided at the second input port is provided at the second output port, and a Cross state in which a desired bandwidth portion of a first input signal provided at the first input port passes to the second output port and a desired bandwidth portion of the second input signal provided at the second input port is provided at the first output port.

19. The system of claim 18, wherein the switch controller controls an amount of current through a first flux bias control line inductively coupled to the first resonator and the second resonator and an amount of current through a second flux bias control line coupled to the third resonator and the fourth resonator, and the polarity of current through one of the first flux bias control line and the second flux bias control line to alternate the system between a Bar state and a Cross state.

20. The system of claim 18, further comprising a first coupling capacitor coupled between the first input port and the first resonator, a second coupling capacitor coupled between the second input port and the second resonator, a third coupling capacitor coupled to the first output port and the third resonator, and a fourth coupling capacitor coupled between the second output port and the fourth resonator.

* * * * *